United States Patent
Gottwald et al.

(10) Patent No.: US 10,424,536 B2
(45) Date of Patent: Sep. 24, 2019

(54) ELECTRONIC COMPONENT HAVING A LEAD FRAME CONSISTING OF AN ELECTRICALLY CONDUCTIVE MATERIAL

(71) Applicant: Schweizer Electronic AG, Schramberg (DE)

(72) Inventors: Thomas Gottwald, Dunningen (DE); Christian Rössle, St. Georgen (DE)

(73) Assignee: SCHWEIZER ELECTRONIC AG, Schramberg (DE)

( * ) Notice: Subject to any disclaimer, the term of this patent is extended or adjusted under 35 U.S.C. 154(b) by 0 days.

(21) Appl. No.: 15/974,474

(22) Filed: May 8, 2018

(65) Prior Publication Data
US 2018/0331024 A1   Nov. 15, 2018

(30) Foreign Application Priority Data

May 15, 2017 (DE) ..................... 10 2017 208 147

(51) Int. Cl.
| | | |
|---|---|---|
| *H01L 23/495* | (2006.01) | |
| *H01L 23/532* | (2006.01) | |
| *G01R 1/20* | (2006.01) | |
| *H05K 1/18* | (2006.01) | |
| *H01L 23/492* | (2006.01) | |
| *H01L 23/62* | (2006.01) | |

(52) U.S. Cl.
CPC ........ *H01L 23/49575* (2013.01); *G01R 1/203* (2013.01); *H01L 23/492* (2013.01); *H01L 23/49568* (2013.01); *H01L 23/49582* (2013.01); *H01L 23/49586* (2013.01); *H01L 23/5329* (2013.01); *H01L 23/53228* (2013.01); *H01L 23/62* (2013.01); *H05K 1/181* (2013.01); *H01L 2224/18* (2013.01)

(58) Field of Classification Search
None
See application file for complete search history.

(56) References Cited

U.S. PATENT DOCUMENTS

| | | | | |
|---|---|---|---|---|
| 4,257,061 | A * | 3/1981 | Chapel, Jr. | G01R 19/03 257/668 |
| 7,176,579 | B2 * | 2/2007 | Konishi | H01L 23/3121 257/724 |
| 9,048,112 | B2 * | 6/2015 | Pan | H01L 23/49822 |
| 9,559,068 | B2 * | 1/2017 | Hauenstein | H01L 23/13 |
| 9,799,627 | B2 * | 10/2017 | Gogoi | H01L 25/072 |
| 10,015,882 | B1 * | 7/2018 | Murdock | H05K 1/181 |

(Continued)

FOREIGN PATENT DOCUMENTS

| | | |
|---|---|---|
| DE | 10 2016 003 988 A1 | 10/2016 |
| WO | WO 2012/072212 A2 | 6/2012 |

*Primary Examiner* — Andres Munoz
(74) *Attorney, Agent, or Firm* — Shlesinger, Arkwright & Garvey LLP (57) ABSTRACT

Electronic component having a first lead frame consisting of an electrically conductive material. The first lead frame carries a first semiconductor component. In the plane of the lead frame a shunt element is arranged, wherein the shunt element comprises a resistor body arranged between a first terminal contact and a second terminal contact. An electrically conducting connection extends from a terminal of the first semiconductor component through the first lead frame to the first terminal contact of the shunt element. A current measurement with good accuracy is facilitated.

17 Claims, 7 Drawing Sheets

(56) References Cited

U.S. PATENT DOCUMENTS

| | | | |
|---|---|---|---|
| 2009/0218665 A1* | 9/2009 | Yang | H01L 23/13 257/676 |
| 2012/0181996 A1* | 7/2012 | Gehrke | H01L 23/49524 323/271 |
| 2014/0055968 A1* | 2/2014 | Chen | H01L 23/64 361/767 |
| 2016/0113117 A1* | 4/2016 | Liu | H05K 1/183 361/720 |
| 2017/0358522 A1* | 12/2017 | Nakamura | H02M 7/537 |

* cited by examiner

Fig. 14

ELECTRONIC COMPONENT HAVING A LEAD FRAME CONSISTING OF AN ELECTRICALLY CONDUCTIVE MATERIAL

RELATED APPLICATIONS

This is a nonprovisional application claiming the priority benefit of Germany Patent Application No. 102017208147.3, filed May 15, 2017, hereby incorporated by reference.

FIELD OF THE INVENTION

The invention relates to an electronic component with a first lead frame consisting of an electrically conductive material. The first lead frame carries a first semiconductor component.

BACKGROUND OF THE INVENTION

It is known to use electrically conducting lead frames in an electronic component for routing electrical currents out of a semiconductor component, EP 2 524 394 A2. In particular, it is possible to also transport fairly high current intensities through such lead frames, which is advantageous for use in power electronics.

If it is intended to measure the intensity of the current flowing through the semiconductor component, the current can be passed through a low-value resistor (shunt) and the voltage drop across the resistor can be measured, DE 10 2016 003 988 A1. From the voltage drop it is possible to deduce the current intensity and therefore the energy consumption.

In order to minimize the dissipation or power loss during the current measurement, shunts with a very low resistance can be used, for example, on the order of 100 µOhm. When such low resistance values are used, care must be taken to ensure that the contact resistances in connecting the shunts are kept to a minimum. Otherwise, the contact resistances can quickly become of the same order of magnitude as the measurement resistor, thereby causing the current measurement to be corrupted.

Surface mounted components have the disadvantage that the resulting power loss is discharged into the environment by convection. The heat transferred to the surrounding air is low, because air is a very poor conductor of heat and the surface area of the component is small. Due to the poor heat dissipation the component heats up strongly at high currents. Due to the change in the material resistance caused by the temperature increase, the measuring accuracy deteriorates when such shunts are used.

SUMMARY OF THE INVENTION

The object of the invention is to present an electronic component in which the current flowing through semiconductor components can be measured with high accuracy. The object is achieved with the features as disclosed herein 1. Advantageous embodiments are specified herein.

In the electronic component according to the invention a shunt element is arranged in the plane of the lead frame. The shunt element has a resistor body arranged between a first terminal contact and a second terminal contact. An electrically conducting connection extends from a terminal of the semiconductor component through the lead frame to the first terminal contact of the shunt element.

By having the shunt element arranged in the plane of the lead frame, a surface extending in the plane of the lead frame or the shunt element can be used for contacting the shunt element. As a result, the contact resistance on entry into the shunt element can be kept low, enabling a good measurement accuracy to be achieved when measuring the electric current.

The first terminal contact, the second terminal contact and the resistor body of the shunt element can be arranged next to each other with respect to the plane of the lead frame. The resistor body can then be arranged between the terminal contacts so that the electrical connection between the terminal contacts is produced by the resistor body. With respect to the plane of the lead frame, the terminal contacts can occupy at least 50%, preferably at least 60%, more preferably at least 70% of the surface area of the shunt element. Each of the terminal contacts can therefore occupy a larger surface area than the resistor body. A large-area terminal contact is advantageous to be able to contact the shunt element with low contact resistance. A further advantage of the large terminal contacts lies in the fact that the power loss generated in the resistor body is spread over the terminal contacts. This reduces the thermal resistance due to the electrically insulating layer to the heat sink.

The resistor body can extend over the entire width of the shunt element, so that the resistor body forms a barrier between the terminal contacts. The width of the shunt element can be, for example, between 5 mm and 20 mm. In the length of the shunt elements the first terminal contact, the resistor body and the second terminal contact can be arranged behind one another. The length of the shunt element can be, for example, between 10 mm and 30 mm. The shunt element can have a thickness between 0.5 mm and 2 mm, preferably between 1 mm and 1.5 mm. The thickness of the resistor body can be the same as the thickness of the terminal contacts. The thickness of the resistor body may be less than the thickness of the terminal contacts.

The terminal contacts of the shunt element can be made of a material with a high conductivity. Particularly suitable are, in particular, a metallic material, such as copper. The conductivity of the resistor body may be less than the conductivity of the terminal contacts. An advantageous material is one in which the electrical resistance is only weakly dependent on the temperature. Suitable materials will be known to the person skilled in the art. Possible choices, for example, are a copper-nickel-manganese alloy known under the name Manganin (registered trade mark), with a composition (mass proportions) of 82-84% copper, 12-15% manganese and 2-4% nickel.

The two terminals of the shunt element can be electrically and mechanically connected to the resistor body so that the desired resistance value is formed between the terminal contacts. The resistance value can be, for example, between 30 µOhm and 200 µOhm, preferably between 50 µOhm and 100 µOhm.

The first semiconductor component connected to the first lead frame can be a power semiconductor component, for example in the form of a MOSFET. The semiconductor component can comprise a gate, a source and a drain terminal. The semiconductor component can extend in a plane parallel to the lead frame. The gate and the source terminal can be arranged on one side of the semiconductor component. The drain terminal can be arranged on the opposite side of the semiconductor component. The drain and source terminal can be designed to have a large surface area, so that it is possible to inject large currents into the semiconductor component. For example, the drain and the source terminal can extend over at least 50%, preferably at least 70% of the area spanned by the semiconductor component. The semiconductor component can be designed to take a current of more than 100 A, in particular for a current of between 200 A and 800 A.

The first semiconductor component can be connected to the first lead frame with its rear face. The gate terminal and the source terminal can be accessible from the opposite side of the semiconductor component. The drain terminal can be accessible from the rear face of the semiconductor component. The first semiconductor component can be arranged in a recess of the first lead frame. The recess can be dimensioned in such a way that the semiconductor component does not protrude over the top of the lead frame, which surrounds the recess. In particular, the top face of the semiconductor component can terminate flush with this surface, so that the gate contact and the source contact, and possibly also the drain contact, lie in the same plane as the top face of the first lead frame.

The plane of the lead frame is defined as any plane parallel to the lead frame, which extends through the lead frame. Within the meaning of the invention the shunt element is arranged in the plane of the lead frame if the height position of the shunt element is such that it is intersected by one of these planes. It is possible for the shunt element to have the same thickness as the lead frame. A top face of the shunt element can then lie in the same plane as a top of the lead frame and a lower surface of the shunt element can lie in the same plane as a lower surface of the lead frame. Thinner shunt elements can also be used, in which case the top face of the shunt will be arranged in the same plane as the surface of the lead frame.

An insulating material can be arranged between the first lead frame and the shunt element. Within the plane of the lead frame, the current cannot then pass directly to the shunt element. There is a electrical connection between the first lead frame and the terminal contact of the shunt element, which is outside the plane of the lead frame.

The insulating material between the shunt element and the lead frame can be an integral part of a sheet consisting of an insulating material. The sheet can be provided with recesses into which the lead frame and the shunt element are mounted. The sheet can have the same thickness as the first lead frame and/or the shunt element.

The electronic component according to the invention can comprise an insulating layer which is arranged between the lead frame or shunt element and the electrical conductor, through which the current is passed from the lead frame to the terminal contact of the hand-held element. The layer can consist of a thermally conducting, electrically non-conducting material, such as a synthetic resin. In particular, the insulating layer can be a prepreg layer. The insulating layer can be, for example, between 50 µm and 200 µm thick. The coefficient of thermal conductivity of the insulating layer can be, for example, between 0.3 W/mK and 5 W/mK.

The electric conductor for transferring currents between the lead frame and the terminal contact of the shunt element can be formed by a layer of an electrically conductive material, which overlaps with the first lead frame and the first terminal contact of the shunt element. The electrically conductive material can be copper, for example. The electrically insulating layer can be arranged between the shunt element and/or the first lead frame and the electrically conducting layer. The electrical connection between the electrically conducting layer and the terminal contact of the shunt element can pass through channels that are formed in the electrically insulating layer. In particular, the channels can be implemented as so-called µ-vias (microvias).

To achieve the desired low contact resistance between the electrically conducting layer and the terminal contact of the shunt element, a fairly large number of channels can be provided, which extend through the insulating layer. The number of channels extending between the electrically conducting layer and the terminal contact can be, for example, between 20 and 400, preferably between 50 and 200.

A larger number of channels can also be provided between the electrically conducting layer and the first lead frame. Since the contact resistance at this point less crucial, the number can be lower than that used for the terminal contact of the shunt element.

The electrical connection between the lead frame and the terminal contact of the shunt element can be manufactured so that a copper foil is first applied to the insulating layer. The channels for contacting the terminal contact and the lead frame can be drilled through the copper foil and the insulating layer. Further copper material can then be added by electroplating, so that the channels are filled up and the copper foil is reinforced with additional copper material. In the final state the electrically conducting layer can be, for example, between 35 µm and 200 µm thick. The contact resistance between the electrically conducting layer and the terminal contact of the shunt element is preferably no greater than 10%, preferably no greater than 5%, more preferably no greater than 1% compared to the resistance of the shunt element.

The electrical insulating layer can be designed in such a way that it covers the lead frame and the semiconductor component. The electrically conducting layer which is applied to the electrically insulating layer can comprise a first section and a second section, which are electrically insulated from one another. The first section of the electrically conducting layer can be arranged above the semiconductor component and be contacted with a source terminal of the semiconductor component. The current transmission between the first lead frame and the first terminal contact of the shunt element can take place via the second section. Direction specifications such as above/below refer to the representation in the drawings and do not limit the invention to a specific alignment of elements.

The first section of the electrically conducting layer can extend in a region arranged next to the lead frame, in which an external contact is implemented, through which the current from the first semiconductor component is routed to the outside. The external contact can comprise one or more press-fit contacts. The press-fit contacts can be aligned perpendicular to the plane of the first lead frame and intersect the plane of the lead frame. The term lead frame can be understood as a general term for an element which exercises a mechanical load-bearing function for a semiconductor component, and through which an electric current can be passed by the semiconductor component.

The electronic component according to the invention can comprise a second lead frame, which is in electrical contact with a terminal of a second semiconductor component. The semiconductor component can be a second power semiconductor, in particular in the form of a MOSFET. The electrical contact can exist between the second lead frame and the drain terminal of the second semiconductor component. The second semiconductor component can be arranged in a recess of the lead frame. The cell formed by the second lead frame and the second semiconductor component can have the same technical features as are described in the context of the first lead frame.

The second lead frame can be arranged in the plane of the first lead frame. The shunt element can be arranged between the first lead frame and the second lead frame. There is thus a straight line extending from the first lead frame to the second lead frame, which intersects the shunt element. The straight line can, in particular, intersect the first terminal contact of the shunt element.

The electrical insulating layer can be designed in such a way that it extends through the first lead frame, the first semiconductor component connected to the first lead frame, a first terminal contact of the shunt element, the second lead frame and the second semiconductor component connected to the second lead frame.

The electrically conducting layer can cover the electrical insulating layer to this extent. The first section of the electrically conducting layer can be in electrical contact with a terminal of the first semiconductor component, in particular, with the source terminal of the first semiconductor component. The first section of the electrically conducting layer can be insulated against the gate connection of the first semiconductor component.

The second section of the electrically conducting layer can be in electrical contact with the first lead frame, with the first terminal contact of the shunt element and with the second semiconductor component. The contact may exist to the source terminal of the second semiconductor component, the gate terminal of the second semiconductor component can be insulated against the second section of the electrically conducting layer.

The electrically conducting layer can comprise a third section, which is isolated from the first section and the second section. The third section of the electrically conducting layer can be connected to the second lead frame in an electrically conducting manner. In the third section of the electrically conducting layer, an external contact may also be formed for discharging electric current to the outside.

The electrically conducting layer can comprise a fourth section, which is electrically insulated against the first section, the second section and the third section of the electrically conducting layer. The fourth section of the electrically conducting layer can be arranged above the second terminal contact of the shunt element. The electrical insulating layer can extend between the fourth section of the electrically conducting layer and the shunt element.

A plurality of channels can be formed in the electrically insulating layer, which extend from the fourth section of the electrically conducting layer to the second terminal contact of the shunt element. The number of channels which extend between the fourth section of the electrically conducting layer and the second terminal contact of the shunt element, for example, can range between 20 and 400, preferably between 50 and 200. The channels can be filled with an electrically conductive material, so that the fourth section of the electrically conducting layer is connected to the second terminal contact of the shunt element with a small contact resistance. The contact resistance is preferably no greater than 10%, more preferably no greater than 5%, more preferably no greater than 1% compared with the resistance of the shunt element.

In the fourth section of the electrically conducting layer a third external contact may also be formed, for example in the form of one or more press-fit contacts.

The electrical contacts from the sections of the electrically conducting layer to the first and second lead frame, to the terminal contact of the shunt element and to the terminals of the first and second semiconductor component can be produced, as described above, by means of channels which extend through the electrical insulating layer and which can be filled with an electrically conductive material.

The electronic component according to the invention can form a half-bridge circuit. The second external contact, which is connected to the second lead frame, can be connected to the positive terminal of a voltage source. The first external contact, which is connected to the source terminal of the first semiconductor component, can be connected to the negative terminal of a voltage source. By means of a controller, the gate terminals of the first and second semiconductor component can be activated alternately. If the gate terminal of the second semiconductor component is activated, then the current can flow from the positive terminal of the voltage source via the second external contact, through the second lead frame and the second semiconductor component to the first terminal contact of the shunt element. If the gate terminal of the first semiconductor component is activated, the current can flow from the first terminal contact of the shunt element through the first lead frame, the first semiconductor component and the first external contact to the negative terminal of the voltage source. At the first terminal contact of the shunt element, an alternating voltage with an approximately sinusoidal waveform can be generated.

The electronic component according to the invention can be designed in such a way that a plurality of semiconductor components are connected in parallel to each other. For example, in a half-bridge circuit, two or more first semiconductor components can be connected in parallel to each other, and two or more second semiconductor components can be connected in parallel to each other. The electronic component can comprise a shunt element, through which the current from all semiconductor components is passed. It is also possible that a plurality of shunts are connected in parallel, from which the current is tapped together.

In the electronic component according to the invention, the phase is not tapped at the first terminal contact, but at the second terminal contact of the shunt element. The current which is diverted through the phase tap is identical to the current that flows through the resistor body of the shunt element. From the voltage drop across the resistor body it is possible to deduce the current intensity.

A measuring device for measuring the voltage across the shunt element can be provided. The measuring device can be connected to an evaluation unit, which determines information about the current intensity from the measurements of the voltage.

The shunt element has large-area terminal contacts, the top face of which is used to inject current into the shunt element with a low contact resistance. The opposite lower face of the shunt element can be used for effective heat distribution. Despite the low electrical resistance of the shunt element, in view of the high current intensities a non-negligible power loss is incurred, which must be dissipated as heat. The lower face of the shunt element can be coated with a heat-conducting layer consisting of an electrically insulating material. The material can be, for example, a synthetic resin material, in particular in the form of prepregs. For an effective heat distribution, the thermally conducting layer can cover the entire shunt element. To provide further heat distribution a metallic layer, for example a copper layer, can be applied to the heat-conducting layer. In order to prevent the heat from being conducted via the copper layer into the area of the lead frames or the semiconductor components, the metallic layer can comprise a section overlapping the shunt element, which is electrically insulated from other sections of the metallic layer. For the heat conduction it is advantageous if this section of the metallic layer extends in one or more directions beyond the periphery of the shunt element.

The invention also comprises embodiments in which the lower face of the electronic component is free of insulating layers.

The invention also relates to a printed circuit board, in which such an electronic component is integrated. A carrier plate, which has a load-bearing function in the printed circuit board and consists of an electrically insulating material, can extend in the plane of the lead frames. The printed circuit board can have a layer structure, in which the carrier plate is fitted with one or more electrically conducting layers. In the case of a plurality of electrically conducting layers, the layers are respectively electrically insulated from each other. In the electrically conducting layers conductor tracks can be formed, which are connected to the external contacts of the electronic component according to the invention. The lower face of the printed circuit board can be fitted with insulating layers. It is also possible that the lower face of the printed circuit board is free of insulating layers.

In one embodiment of the invention, the electronic component according to the invention is fabricated first and then inserted in its entirety into the carrier plate of the logic circuit board. In an alternative embodiment of the invention, the first semiconductor component, the second semiconductor component and the shunt element are inserted into recesses in the carrier plate of the printed circuit board. The additional layer structure can be provided jointly for the electronic component according to the invention and the logic circuit board. Examples of the invention are described below with reference to the attached drawings and based on advantageous embodiments.

DETAILED DESCRIPTION OF THE INVENTION

Figure 1:
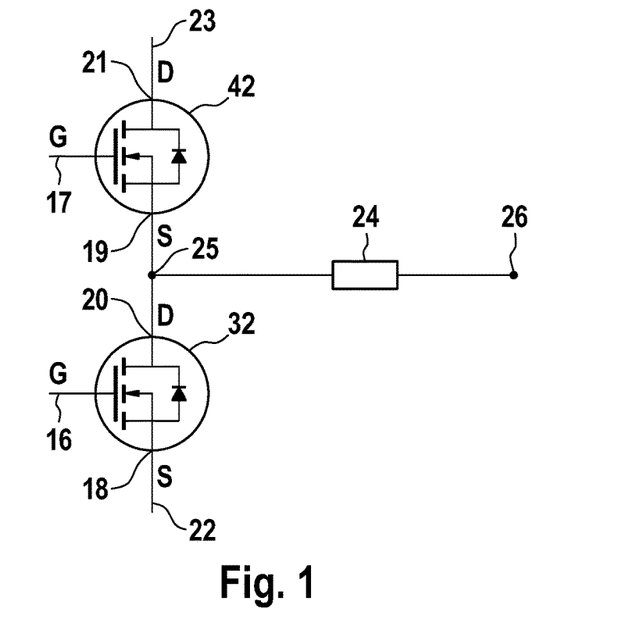
FIG. 1: shows a circuit symbol of an electronic component according to the invention.

An electronic component according to the invention in the form of a half-bridge comprises a first semiconductor component 32 and a second semiconductor component 42. The semiconductor components 32, 42 each have a gate terminal 16, 17, a source terminal 18, 19 and a drain terminal 20, 21. An external contact 23 of the second semiconductor component 42 is connected to the positive terminal of a voltage source, not shown. An external contact 22 of the first semiconductor component 32 is connected to the negative terminal of the voltage source. A shunt element 24 is arranged between the mid-point 25 of the half bridge and a phase tapping point 26.

The gate terminals 16, 17 of the two semiconductor devices 32, 42 are activated alternately, so that the semiconductor components 32, 42 alternately allow electrical current to flow between their drain terminal 20, 21 and their source terminal 18, 19. In this way, an alternating voltage can be generated at the mid-point 25 of the half-bridge. At the phase tapping point 26, an electrical load is connected, for example in the form of a phase of a multiphase motor, so that the entire current flows through the shunt element 24. From a measurement of the voltage dropped across the shunt element 24 it is possible to deduce the current intensity and therefore the energy consumption of the load.

Figure 2:
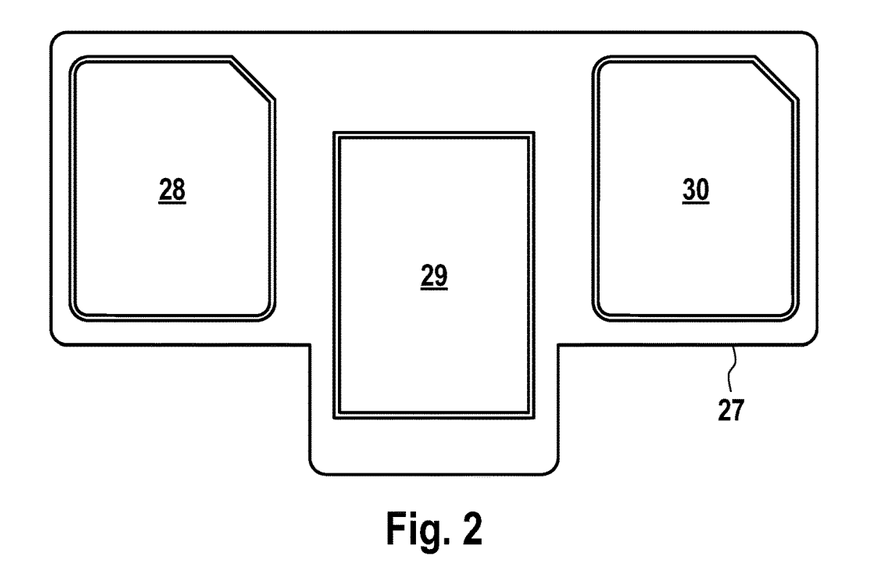
FIGS. 2 to 5: show blank materials for producing an electronic component according to the invention.

To produce an electronic component according to the invention, a carrier plate 27 made of a non-conducting material is first provided. The carrier plate 27 can consist, for example, of a composite material made of epoxy resin and woven glass fibre, such as are known under the name FR-4. In the carrier plate 27 three recesses 28, 29, 30 are formed, which extend through the carrier plate in the form of through holes 27. The carrier plate 27 has a thickness of 1.2 mm. The carrier plate can have conducting layers on the upper and lower face, which are spaced apart from the openings. The conducting layers can consist of copper, for example.

Figure 3:
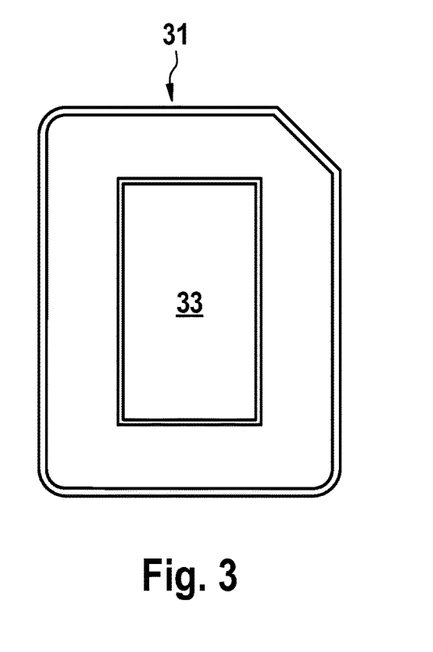
Figure 4:
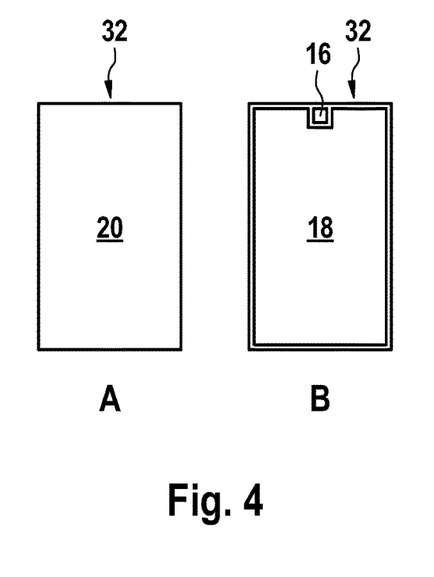

Additionally provided are a first lead frame 31 according to FIG. 3 and a first semiconductor component 32 according to FIG. 4. The semiconductor component 32 is a MOSFET with a gate terminal 16, a source terminal 18 and a drain terminal 20. The source terminal 18 and the drain terminal 20 are large in area and therefore designed for the transmission of high current intensities. The source terminal 18 covers almost the entire upper face, the drain terminal 20 almost the entire lower face of the semiconductor component 32. Only control signals are transmitted via the gate terminal 16, which is why the gate terminal 16 appears much smaller than the source and drain terminals 18, 20.

The first lead frame 31 is provided with a recess 33, which is matched in terms of its dimensions to the size of the first semiconductor component 32. The semiconductor component 32 is inserted in the recess 33, so that the drain terminal 20 is contacted with the lead frame 31 over a large area. The height of the recess 33 matches the height of the first semiconductor component 32, so that the upper face of the first semiconductor component 32 with the gate and source terminals 16, 18 lies in the same plane as the surface of the lead frame 31. The lead frame 31 has a height of 1.2 mm.

Figure 5:
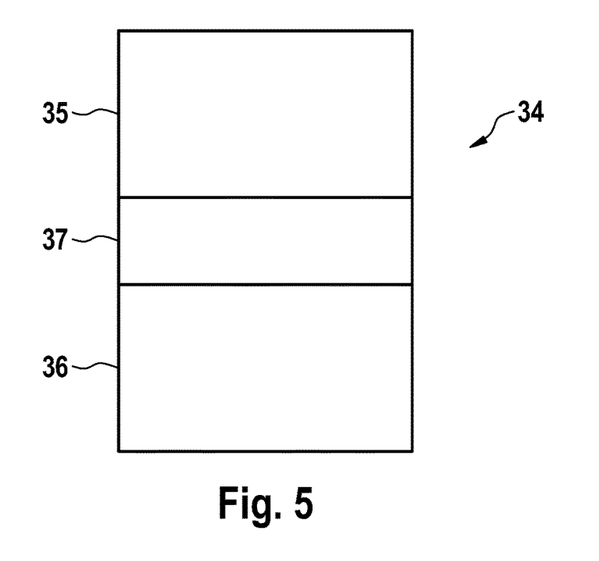

A second cell with corresponding structure is provided. The second cell comprises a second lead frame 41 and a second semiconductor component 42.

Finally, a shunt element 34 is provided, which is composed of a first terminal contact 35, a second terminal contact 36 and a resistor body 37 arranged between the terminal contacts 35, 36. The terminal contacts 35, 36 are made of copper, and the resistor body 37 positioned between them of Manganin. The shunt element 34 has a resistance between 50 µOhm and 100 µOhm between the terminal contacts 35, 36. The thickness of the shunt element 34 is 1.2 mm. The thickness of the shunt element 34 is therefore identical to the thickness of the first and second lead frames 31, 41, and in addition, identical to the thickness of the carrier plate 27. In terms of area, the shunt element 34 extends in both directions for several millimetres.

Figure 6:
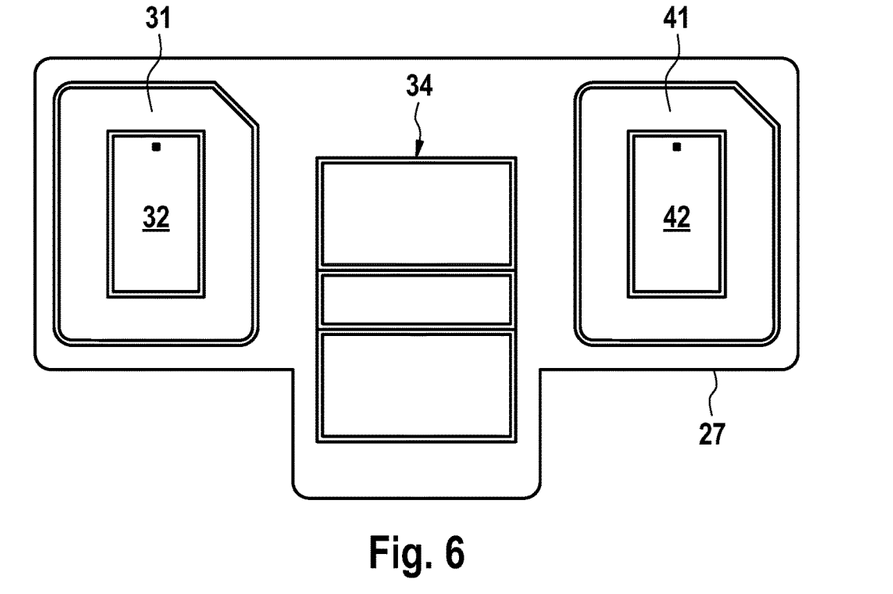
FIGS. 6 to 9: show intermediate stages in the production of an electronic component according to the invention.
Figure 7:
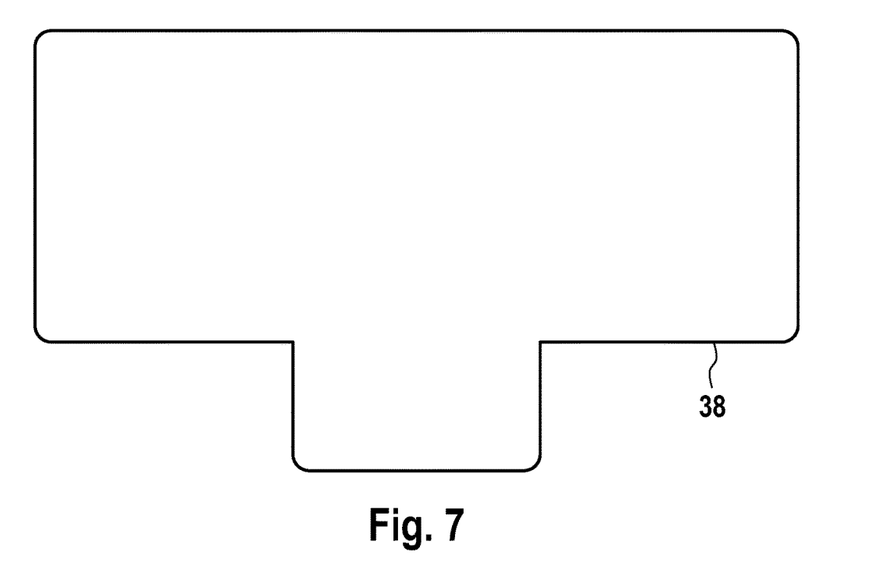

The shunt element 34 as well as the two lead-frames 31, 41 with the semiconductor components 32, 42 are inserted into the recesses 28, 29, 30 of the carrier plate 27 according to FIG. 6. According to FIG. 7, an electrically insulating layer 38 made of a prepreg material is applied to the upper face of the carrier plate 27 so that the first lead frame 31, the second lead frame 41 and the shunt element 34 are covered by the electrically insulating layer 38.

Figure 8:
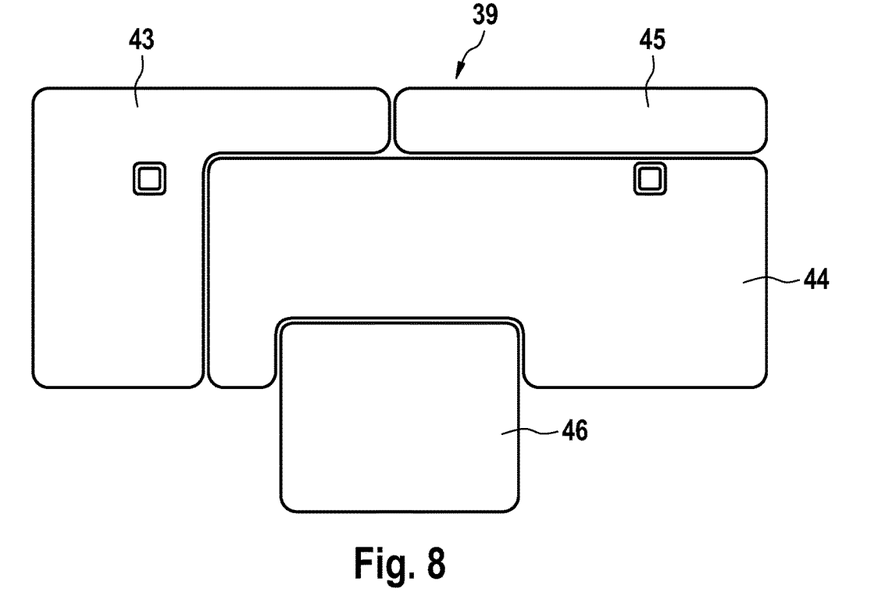

In accordance with FIG. 8, an electrically conducting layer 39 applied to the electrically insulating layer 38 comprises a first section 43, a second section 44, a third section 45 and a fourth section 46. The sections 43, 44, 45, 46 are electrically insulated from each other. In the first section 43 and the second section 44, two contacts for the gate terminals 16, 17 are also formed, which are electrically isolated from the sections 43, 44.

The electrically conducting layer 39 is initially electrically isolated from the lead frames 31, 41, from the semiconductor devices 32, 42 and from the shunt element 34. The electrical connection between the electrically conducting layer 39 and these elements is produced via channels which extend through the electrically insulating layer 38. In accordance with FIG. 9, in the first section 43 of the electrically conducting layer 39 a first set 47 of channels is formed, which extend through the electrically conducting layer 39 and through the electrically insulating layer 38 up to the source terminal 18 of the first semiconductor component 32.

Figure 9:
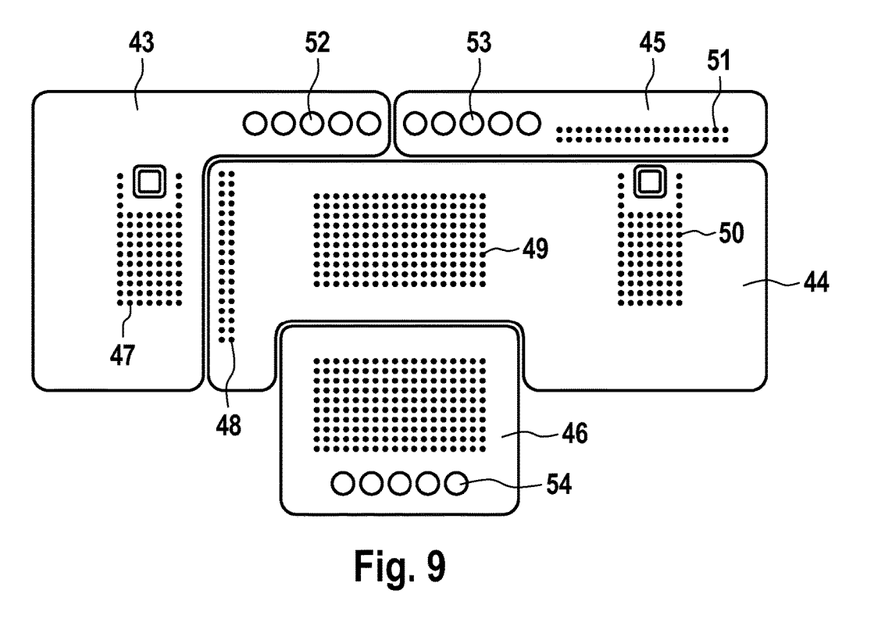

In the second section 44 of the electrically conducting layer 39, a second set 48 of channels is formed, which extend through the electrically conducting layer 39 and through the electrically insulating layer 38 up to the first lead frame 31. A third set 49 of channels extends through the electrically conducting layer 39 and through the electrically insulating layer 38 up to the first terminal contact 35 of the shunt element 34. A fourth set 50 extends through the electrically conducting layer 39 and through the electrically insulating layer 38 up to the source terminal 19 of the second semiconductor component 42.

In the third section 45 of the electrically conducting layer 39, a fifth set 51 of channels is formed, which extend through the electrically conducting layer 39 and through the electrically insulating layer 38 to the second lead frame 41. In the fourth section 46 of the electrically conducting layer 39, a sixth set 51 of channels is formed, which extend through the electrically conducting layer 39 and through the electrically insulating layer 38 up to the second terminal contact 36 of the shunt element 34.

If copper is then applied to the surface of the semi-finished product in an electroplating process, this fills the channels and forms an electrical connection between the terminals located underneath the insulating layer 38 and the electrically conducting layer 39. At the same time the electrically conducting layer 39 is further built up and reinforced. In a subsequent step, the sections 43, 44, 45, 46 of the electrically conducting layer 39 are electrically insulated from one another.

In order to keep to a minimum the contact resistance between the second section 44 of the electrically conducting layer 39 and the first terminal contact 35 of the shunt element 34 and the contact resistance between the fourth section 46 of the electrically conducting layer and the second terminal contact 36 of the shunt element, the surface area of the terminal contacts 35, 36 are occupied as densely as possible with channels. In the exemplary embodiment, the number of channels per terminal contact 35, 36 is around 100. For the remaining terminals the number of channels is selected such that a sufficiently good current conduction is obtained for the application.

The external contact 22 of the first semiconductor component 32 in the form of five press-fit contacts 52 is inserted into the first section 43 of the electrically conducting layer 39. The external contact 23 of the second semiconductor component 42 in the form of five press-fit contacts 53 is inserted into the third section 45 of the electrically conducting layer 39. The external contact for the phase tap 26 of the half-bridge in the form of five press-fit contacts 54 is inserted into the fourth section 46 of the electrically conducting layer 39.

Figure 10:
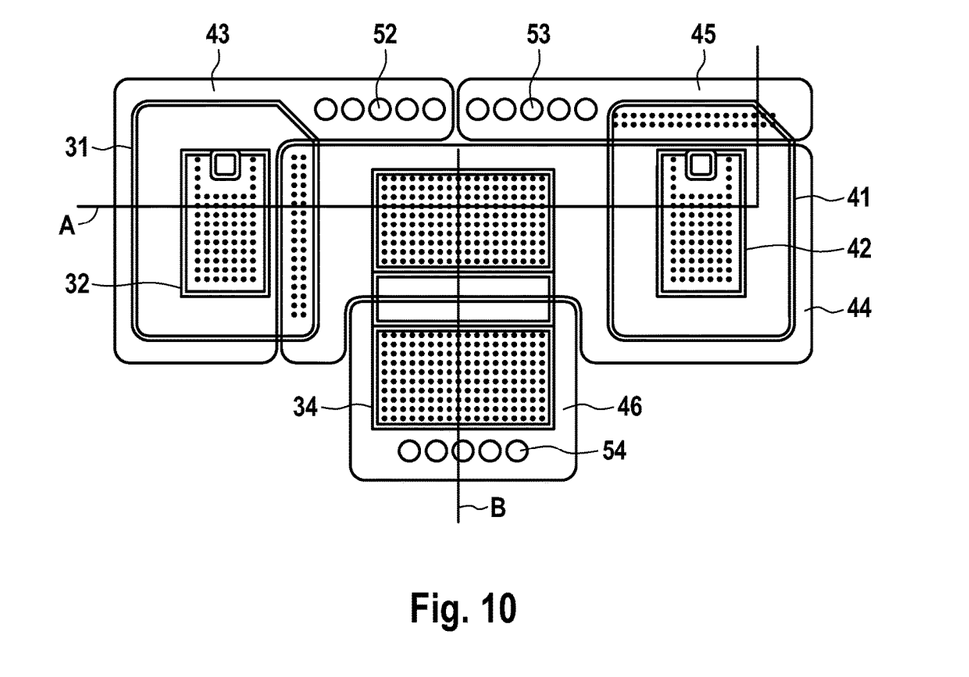
FIG. 10: shows a schematic illustration of an electronic component according to the invention.
Figure 11:
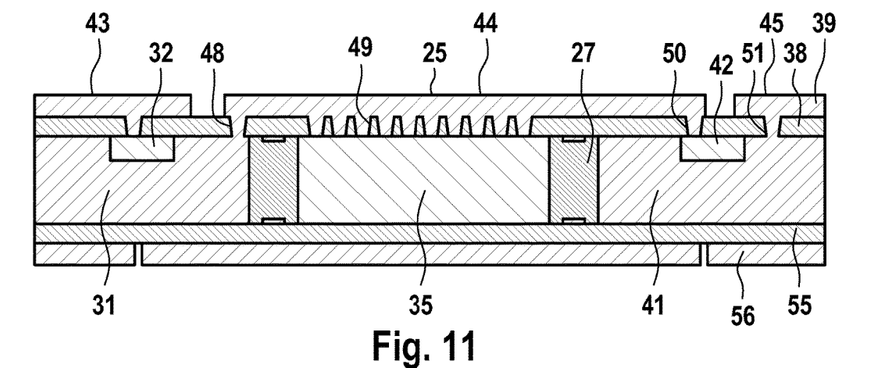
FIG. 11: shows a section along line A in FIG. 10.
Figure 12:
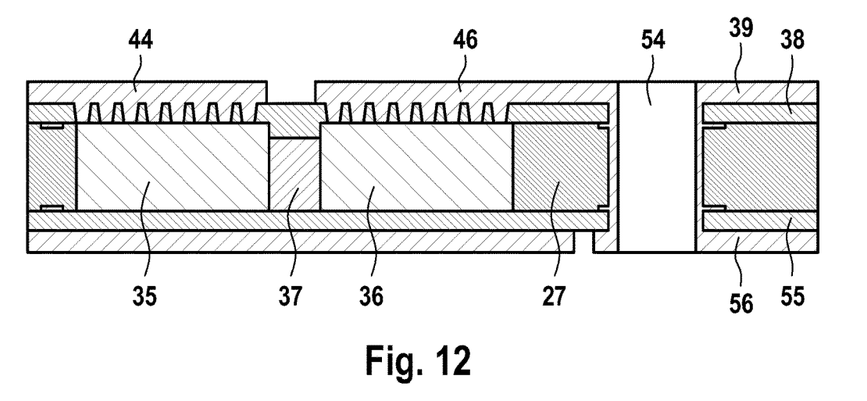
FIG. 12: shows a section along line B in FIG. 10.

FIG. 10 shows the different layers of the electronic component according to the invention in an overlaid view. FIGS. 11 and 12 show cross-sectional drawings along the lines A and B in FIG. 10. Via the third section 45 of the electrically conducting layer 39, the second lead frame 41 is connected to the positive terminal of the voltage source. If the second semiconductor component 42 is activated by a control voltage on the gate terminal 17, the current flows through the second semiconductor component 42 and through the second section 44 of the electrically conducting layer 39 to the mid-point 25 of the half bridge, and from there to the press-fit contacts 54 of the phase tap 26.

After inactivation of the second semiconductor component 42 a control voltage can be applied to the gate terminal 16, in order to activate the first semiconductor component 32. This results in a current flow from the press-fit contacts 54 of the phase tap 26 through the fourth section 46 of the electrically conducting layer 39, through the second terminal contact 36 of the shunt element 34, through the first terminal contact 35 of the shunt element 34, through the second section 44 of the electrically conducting layer 39, into the first lead frame 31 and through the first semiconductor component 32 to the first section 43 of the electrically conducting layer 39 and to the press-fit contacts 52 of the external contact 22.

A heat-conducting layer 55 extends on the lower face of the shunt element 34, which layer is in turn fitted with a copper layer 56.

A section of the copper layer 56 covering the shunt element 34 is electrically insulated against other sections of the copper layer. Via the layers 55, 56, the heat generated in the shunt element 34 is distributed.

Figure 13:
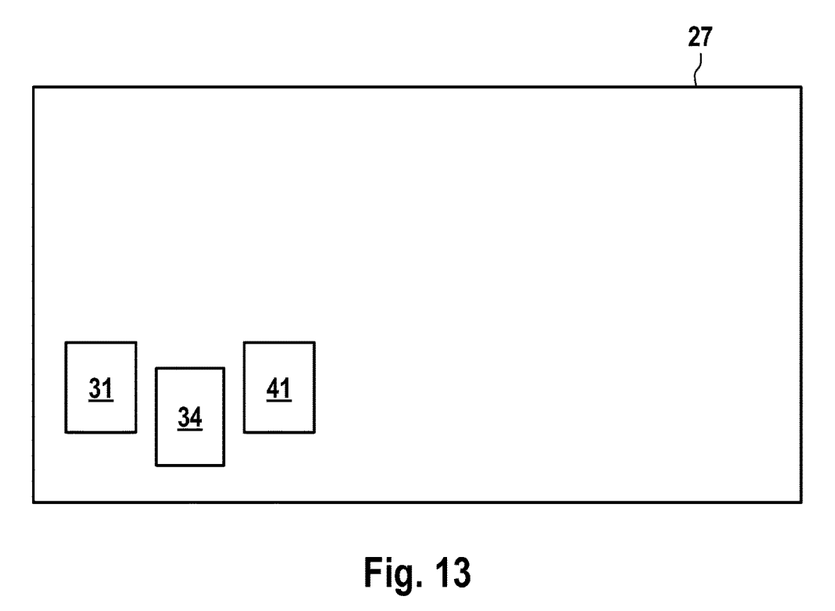
FIG. 13: shows a schematic illustration of a printed circuit board according to the invention.

FIG. 13 shows an embodiment of a logic circuit board according to the invention, in which a first lead frame 31, a second lead frame 41 and a shunt element 34 are inserted into a carrier plate 27. With the additional layer structure, the electronic component according to the invention and the logic board are completed together.

Figure 14:
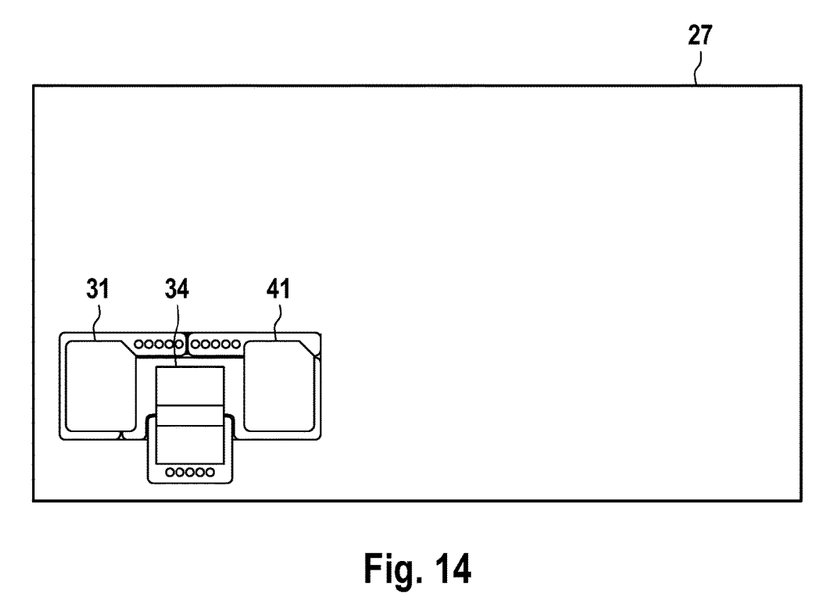
FIG. 14: shows the view in accordance with FIG. 13 in an alternative embodiment of the invention.

In the embodiment according to FIG. 14, the electronic component according to the invention is inserted into a recess in an otherwise partially finished logic printed circuit board. The electrical connection between the areas is made via additionally applied circuit layers.

We claim:

1. An electronic component, comprising:
a first lead frame consisting of an electrically conductive material;
the first lead frame carries a first semiconductor component, and with a shunt element arranged in a plane of the first lead frame;
the shunt element comprises a resistor body arranged between a first terminal contact and a second terminal contact;
an electrically conducting connection extends from a terminal of the first semiconductor component through the first lead frame to the first terminal contact of the shunt element; and
the first terminal contact, the second terminal contact and the resistor body of the shunt element are arranged next to each other with respect to the plane of the first lead frame.

2. The electronic component according to claim 1, wherein with respect to the plane of the first lead frame, the first and second terminal contacts together occupy at least 50% of the surface area of the shunt element.

3. The electronic component according to claim 1, wherein the shunt element has a resistance between 30 µOhm and 200 µOhm.

4. The electronic component according to claim 1, wherein the first semiconductor component is designed for a current intensity of more than 100 A.

5. The electronic component according to claim 1, wherein the first lead frame has a recess in which the first semiconductor component is arranged.

6. The electronic component according to claim 5, wherein a top of the first semiconductor component lies in the same plane as a top of the first lead frame.

7. The electronic component according to claim 1, wherein a top of the shunt element lies in the same plane as a top of the first lead frame.

8. The electronic component according to claim 1, wherein an insulating material is arranged between the first lead frame and the shunt element.

9. The electronic component according to claim 1, wherein an electrical connection between the first lead frame and the first terminal contact of the shunt element comprises channels which extend from an electrically conducting layer through an electrically insulating layer to the first terminal contact of the shunt element.

10. The electronic component according to claim 9, wherein a number of channels between the electrically conducting layer and the first terminal contact of the shunt element is greater than 20.

11. The electronic component according to claim 9, wherein a contact resistance between the electrically conducting layer and a terminal contact of the shunt element is no greater than 10% compared to the resistance of the shunt element.

12. The electronic component according to claim 1, wherein a second lead frame is arranged in the plane of the first lead frame.

13. The electronic component according to claim 12, wherein the first semiconductor component and a second semiconductor component connected to the second lead frame are connected as a half-bridge and that the first terminal contact of the shunt element is connected to a center of the half-bridge.

14. A printed circuit board, comprising:
the electronic component according to claim 1; and
wherein the printed circuit board comprises a carrier plate which has a load-bearing function in the printed circuit board and which consists of an electrically insulating material, wherein the first lead frame is arranged in a plane of the carrier plate.

15. An electronic component, comprising:
a first lead frame consisting of an electrically conductive material;
the first lead frame carries a first semiconductor component, and with a shunt element arranged in a plane of the first lead frame;
the shunt element comprises a resistor body arranged between a first terminal contact and a second terminal contact;
an electrically conducting connection extends from a terminal of the first semiconductor component through the first lead frame to the first terminal contact of the shunt element; and
the first lead frame has a recess in which the first semiconductor component is arranged.

16. An electronic component, comprising:
a first lead frame consisting of an electrically conductive material;
the first lead frame carries a first semiconductor component, and with a shunt element arranged in a plane of the first lead frame;
the shunt element comprises a resistor body arranged between a first terminal contact and a second terminal contact; an electrically conducting connection extends from a terminal of the first semiconductor component through the first lead frame to the first terminal contact of the shunt element; and
a top of the shunt element lies in the same plane as a top of the first lead frame.

17. An electronic component, comprising:
a first lead frame consisting of an electrically conductive material;
the first lead frame carries a first semiconductor component, and with a shunt element arranged in a plane of the first lead frame;
the shunt element comprises a resistor body arranged between a first terminal contact and a second terminal contact;
an electrically conducting connection extends from a terminal of the first semiconductor component through the first lead frame to the first terminal contact of the shunt element; and
an electrical connection between the first lead frame and the first terminal contact of the shunt element comprises channels which extend from an electrically conducting layer through an electrically insulating layer to the first terminal contact of the shunt element.

* * * * *